United States Patent
Fraser

[11] 3,949,131
[45] Apr. 6, 1976

[54] PHOTOMASKS WITH ANTISTATIC CONTROL

[75] Inventor: David Bruce Fraser, Berkeley Heights, N.J.

[73] Assignee: Bell Telephone Laboratories, Incorporated, Murray Hill, N.J.

[22] Filed: June 19, 1974

[21] Appl. No.: 480,618

[52] U.S. Cl. ............................... 428/201; 428/539
[51] Int. Cl.[2] ................................................ B05D 5/12
[58] Field of Search ........... 117/211, 215, 217, 212; 204/192; 427/108, 126; 428/201, 539

[56] References Cited
UNITED STATES PATENTS

| | | | |
|---|---|---|---|
| 2,887,412 | 5/1959 | Thomas | 117/211 |
| 2,894,858 | 7/1959 | Lytle | 117/211 |
| 3,210,214 | 10/1965 | Smith | 117/212 |
| 3,443,915 | 5/1969 | Wood et al. | 117/211 |
| 3,681,227 | 8/1972 | Szupillo | 117/211 |
| 3,686,028 | 8/1972 | O'Keeffe | 117/212 |
| 3,801,418 | 4/1974 | Cornelis et al. | 117/211 |

OTHER PUBLICATIONS
Fraser et al., *Highly Conductive, Transparent Films of Sputtered $In_{2-x}Sn_xO_{3-y}$.* In J. Electrochem. Soc.: Solid-State Science and Technology, 119(10): pp. 1368–1374, Oct. 1972.

*Primary Examiner*—Cameron K. Weiffenbach
*Attorney, Agent, or Firm*—P. V. D. Wilde

[57] ABSTRACT

In high resolution lithography, resolution impairment sometimes occurs due to dust collecting on the mask. The dust is often attracted to the mask by static electricity. The solution proposed is to coat the entire photomask with a transparent, electrically conductive coating. The coating is electrically grounded to drain static charge. Conductive materials are often used for lithographic masks, but the patterns cannot be grounded effectively because there are island regions in the pattern.

If the pattern is itself conducting, there is the added option of applying the antistatic layer under the pattern.

If the pattern is formed of a photographic emulsion of a patterned photoresist, it is protected from damage and wear in handling by the harder conductive coating.

6 Claims, 1 Drawing Figure

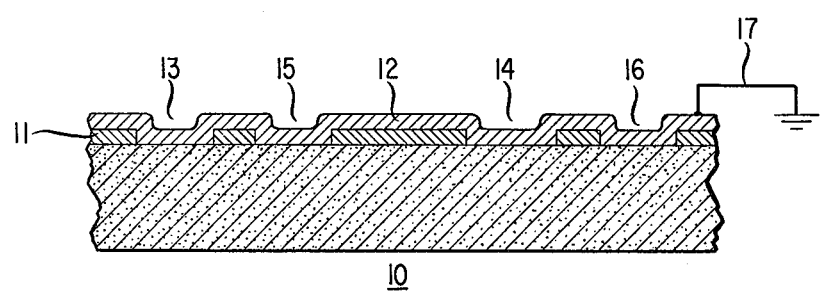

PHOTOMASKS WITH ANTISTATIC CONTROL

BACKGROUND OF THE INVENTION

Advances in photolithography are acknowledged to be the key to further increases in packing density for microcircuits. These in turn will result in lower costs for integrated circuits. As the feature size in photomasks becomes smaller, it becomes more difficult to exclude the effects of microscopic foreign particles on the lithographic resolution. The art has reached the point where very small dust particles are comparatively large enough to cause pattern defects. A solution to this is to use electron beam lithography because the small dust particles are transparent to electrons and will not interfere with the exposure of the pattern. However, photolithography continues to be widely used and there is ample room for continued advances in this technology.

Prior to this invention, eliminating mask defects that result from dust interfering with the optical exposure of the mask has simply been a matter of controlling the cleanliness of the processing environment. This is a conventional control measure that is used in all semiconductor processing. However, controlling particles of a size that can interfere with very high resolution photolithography is difficult and expensive.

The problem of dust particles adhering to the photomask is aggravated by the tendency of the mask to accumulate and retain static electrical charge when exposed to intense actinic radiation. The static charge attracts dust.

STATEMENT OF THE INVENTION

This invention is directed to a solution to this problem and that is to coat the photomask with a continuous conductive transparent coating and to electrically ground the coating to prevent the buildup of static charge. Typical coating materials happen also to be hard relative to common photographic emulsion photomask materials and will impart a useful degree of abrasion and wear protection. Any manner of extending the usable life of an expensive photomask is a significant advance in this art.

The transparent conductive coating can comprise any of a variety of materials. Even materials that are normally regarded as opaque can be used if the coating is very thin. For example, a few hundred angstroms of gold deposited by standard evaporation is quite transparent and useful in this context. However, preferred coatings are made from materials that are more transparent, such as tin oxide and indium oxide, and materials based on these compounds such as antimony-doped tin oxide, tin-doped indium oxide, and materials in the system indium-tin-oxide. These materials, the properties that make them useful for this invention, and methods for depositing them in appropriate thin coatings are known in the literature. See, R. E. Aitchison, *Australian J. Appl. Sci.*, 5, p. 10 (1954); H. K. Muller, *Phys. Status Solids*, 27, p. 723 (1968); L. I. Burbulyavichus et al., *Izv. Akad. Nauk. SSSR Neorgan. Mat.*, 5, p. 551 (1969); (a) V. A. Williams, *This Journal*, 113, p. 234 (1966) — (b) Y. T. Sihvonen and D. R. Boyd, *Rev. Sci. Instr.*, 31, p. 992 (1960) — (c) V. M. Vainshtein et al., *Izvt. Akad. Nauk. SSSR Neorgan. Mat.*, 4, 357 (1968) — (d) J. M. Pankratz, Paper 28, *AIME*, 1971 Conference, San Francisco, California; J. L. Vossen, *RCA Rev.*, 32, p. 289 (1971); S. Yamanaka and T. Oohashi, *Jap. J. Appl. Phys.*, 8, p. 1058 (1969); J. L. Vossen, Third Symposium On Deposition of Thin Films by Sputtering, University of Rochester, Sept. 9, 1969; D. B. Fraser and H. D. Cook, "Highly Conductive, Transparent Films of Sputtered $In_{2-x}Sn_xO_{3-y}$," *Journal of the Electrochemical Society*, Vol. 119, No. 10, 1368, October 1972.

Although the coatings of the invention have value as applied to emulsion photomasks, they provide the same antistatic control when applied to the so-called hard mask materials such as chromium and iron oxide. Although these hard materials typically are themselves conductive, the mask patterns that are formed in them normally contain island regions. These are electrically isolated and capable of accumulating charge even if care is taken to drain static charge from the rest of the mask.

DETAILED DESCRIPTION OF THE INVENTION

The following description illustrates in greater detail the use of photomasks coated in accordance with the invention.

The FIGURE is a front sectional view of a photomask made in accordance with the invention.

The photomask structure is simple in cross section. It consists typically of a glass slide 10, made of high-grade optical glass and made optically flat, covered with the masking pattern 11. The thickness of the substrate is not important. Normal thicknesses are in the range of 10 to 100 mils. The layer 11 can be any of a variety of materials as pointed out above. The thickness of these films is typically of the order of a fraction to a few microns. The pattern shown in the FIGURE could be used to develop, in a silicon dioxide layer, an etch mask to form source (13,14) and drain (15,16) windows for a C-MOS device. The details of the pattern are unrelated to the invention except that the invention is most advantageously used where fine resolution (less than 1 micrometer) is needed for the smallest features.

In the case where the mask pattern is formed from a photographic emulsion, the layer 11 will appear continuous in cross section, but with regions of darkened emulsion forming the mask pattern. If the mask layer 11 is a patterned photoresist, the photoresist material must be rendered opaque to the actinic radiation. Conveniently, organic photoresist materials darken when exposed in a typical diode-sputtering apparatus and this has been found to be adequate to achieve the objective of the invention. The darkening is similar to that described in the B. H. Johnson (Case 5) application, Ser. No. 407,529, filed Oct. 18, 1973, except that organic photoresists darkened by sputtering are believed to have more dimensional stability than those darkened by heating, and dimensional stability is important in photolithography. Photographic emulsions tend likewise to darken, but this can be avoided by lowering the sputtering energy. Sputtering energies normally encountered using the well-known "sputter gun" are low enough to allow coating of emulsions without excessive discoloration.

The inventive element of the FIGURE is the conductive, transparent coating 12 that is continuous over the entire pattern. The ground wire used to drain the static charge is shown at 17. In actual use, this may be simply a metal holddown for the mask. This coating may have a thickness similar to that of the resist layer 11. It can consist of a variety of materials as indicated before. A material that is particularly well adapted for this invention is $In_{2-x}Sn_xO_{3-y}$, where $x$ varies from zero to two and $y$ varies slightly, i.e., from 0 to 0.02, to allow for some oxygen deficiency. Ternary materials in this system were investigated thoroughly from the standpoint of conductivity and transparency and the results are reported in the *Journal of the Electrochemical Society*, Vol. 119, No. 10, pp. 1368 to 1374, 1972. Films in this ternary system and appropriate for use with this invention can be deposited with a thickness in the range of 50 A. to 1000 A. giving a resistance of the order of a few to a few thousand ohms per square and adequate transparencies. A typical film actually used to demonstrate the usefulness of these optical transmittance spectrum for a 0.5 micrometer film antistatic photomask had a thickness of 200 A. and a composition of $In_{.98}Sn_{.02}O_3$ giving a resistance of 300 $\Omega$/ square and a transparency at 0.5 micrometers of 84%.

This film coated on an iron oxide photomask was found to accumulate less dust and dirt, not only in use but during storage if properly grounded. The latter result was considered to be unusual and reduces the problems associated with cleaning.

Various additional modifications of the invention will occur to those skilled in the art. All variations that rely basically on the teachings through which this invention has advanced the art are properly considered to be within the scope of this invention.

What is claimed is:

1. A photomask for use in photolithographic processing of semiconductor microcircuits comprising a rigid, transparent plate, a patterned photomask coating on the plate, the coating having void spaces representing a positive or negative image of at least partial features of said microcircuit, a continuous, transparent, electrically conductive film covering the photomask pattern and the void spaces, and electrical contact means for electrically grounding the film.

2. The photomask of claim 1 in which the coating is an emulsion resist.

3. The photomask of claim 1 in which the coating is chromium or iron oxide.

4. The photomask of claim 1 in which the coating is an organic layer darkened by sputter deposition.

5. The photomask of claim 1 in which the transparent, electrically conductive film comprises a material represented by the formula $In_{2-x}Sn_xO_{3-y}$, where $x$ can vary from zero to two and $y$ from zero to 0.02.

6. The photomask of claim 5 in which $x$ is a finite number.

* * * * *